United States Patent
Ueda et al.

(10) Patent No.: US 7,700,392 B2
(45) Date of Patent: Apr. 20, 2010

(54) MANUFACTURING METHOD OF SEMICONDUCTOR LASER DEVICES AND MANUFACTURING APPARATUS OF THE SAME

(75) Inventors: Tetsuzo Ueda, Toyonaka (JP); Hisanori Ishiguro, Kusatsu (JP)

(73) Assignee: Panasonic Corporation, Osaka (JP)

( * ) Notice: Subject to any disclaimer, the term of this patent is extended or adjusted under 35 U.S.C. 154(b) by 195 days.

(21) Appl. No.: 11/286,348

(22) Filed: Nov. 25, 2005

(65) Prior Publication Data
US 2006/0110894 A1    May 25, 2006

(30) Foreign Application Priority Data
Nov. 25, 2004    (JP)    ............................. 2004-340753

(51) Int. Cl.
H01L 21/78    (2006.01)
H01L 21/301    (2006.01)
H01L 21/46    (2006.01)

(52) U.S. Cl. .......... 438/33; 257/E21.214; 257/E21.237; 257/E21.438; 438/460; 438/463; 438/464

(58) Field of Classification Search ................. 438/463, 438/33, 460, 464; 257/E21.438, E21.214, 257/E21.237
See application file for complete search history.

(56) References Cited

U.S. PATENT DOCUMENTS

| | | | |
|---|---|---|---|
| 3,112,850 A * | 12/1963 | Garibotti | 225/2 |
| 6,735,230 B1 * | 5/2004 | Tanabe et al. | 372/43.01 |
| 2004/0020601 A1 * | 2/2004 | Zhao et al. | 156/345.32 |
| 2004/0055634 A1 | 3/2004 | Yamaguchi | |
| 2004/0241570 A1 * | 12/2004 | Shibata et al. | 430/199 |
| 2004/0259329 A1 * | 12/2004 | Boyle et al. | 438/460 |
| 2005/0029646 A1 * | 2/2005 | Ueda et al. | 257/687 |

FOREIGN PATENT DOCUMENTS

| | | |
|---|---|---|
| JP | 54/6864 | 2/1979 |
| JP | 08-236867 | 9/1996 |
| JP | 10-242570 | 9/1998 |
| JP | 11-307861 | 11/1999 |

(Continued)

OTHER PUBLICATIONS

Schollhammer et al., Electron Beam Cutting Techniques for Electronic Applications, IEEE Transactions on Product Engineering and Production, Apr. 1963, p. 16-27.*

(Continued)

*Primary Examiner*—Peniel M Gumedzoe
(74) *Attorney, Agent, or Firm*—Greenblum & Bernstein, P.L.C.

(57) ABSTRACT

The present invention is to provide a semiconductor laser device manufacturing method for realizing highly reliable semiconductor laser devices. The semiconductor laser device manufacturing method includes: cutting a wafer into bar-shaped wafers by scanning an electron beam on the front side of the wafer on which a semiconductor laser structure has been formed so as to cause cracks which trigger the cutting of the wafer; and depositing front and back coating films on the end faces, which have been newly exposed by the cutting of the wafer, of the cut wafers. In the method the cut wafers are transferred in a non-ambient atmosphere at a time between the cutting of the wafer and the depositing of the end face coating films.

15 Claims, 9 Drawing Sheets

FOREIGN PATENT DOCUMENTS

| | | |
|---|---|---|
| JP | 2002-026327 | 2/2002 |
| JP | 2002/344069 | 11/2002 |
| JP | 2003-332273 | 11/2003 |

OTHER PUBLICATIONS

English Language Abstract of JP 2003-332273.
English Language Abstract of JP 08-236867.
English Language Abstract of JP 10-242570.
Shoji Hirata, "Wakaru Handotai no Kiso to Ohyo," published by CQ Press, p. 122, Nov. 21, 2001, along with an English language translation and a copy of the bibliographic page.
English Language Abstract of JP 2002-34406.
English Language Abstract of JP 54-6864.
English Language Abstract of JP 2002-026327.
English Language Abstract of JP 11-307861.

* cited by examiner

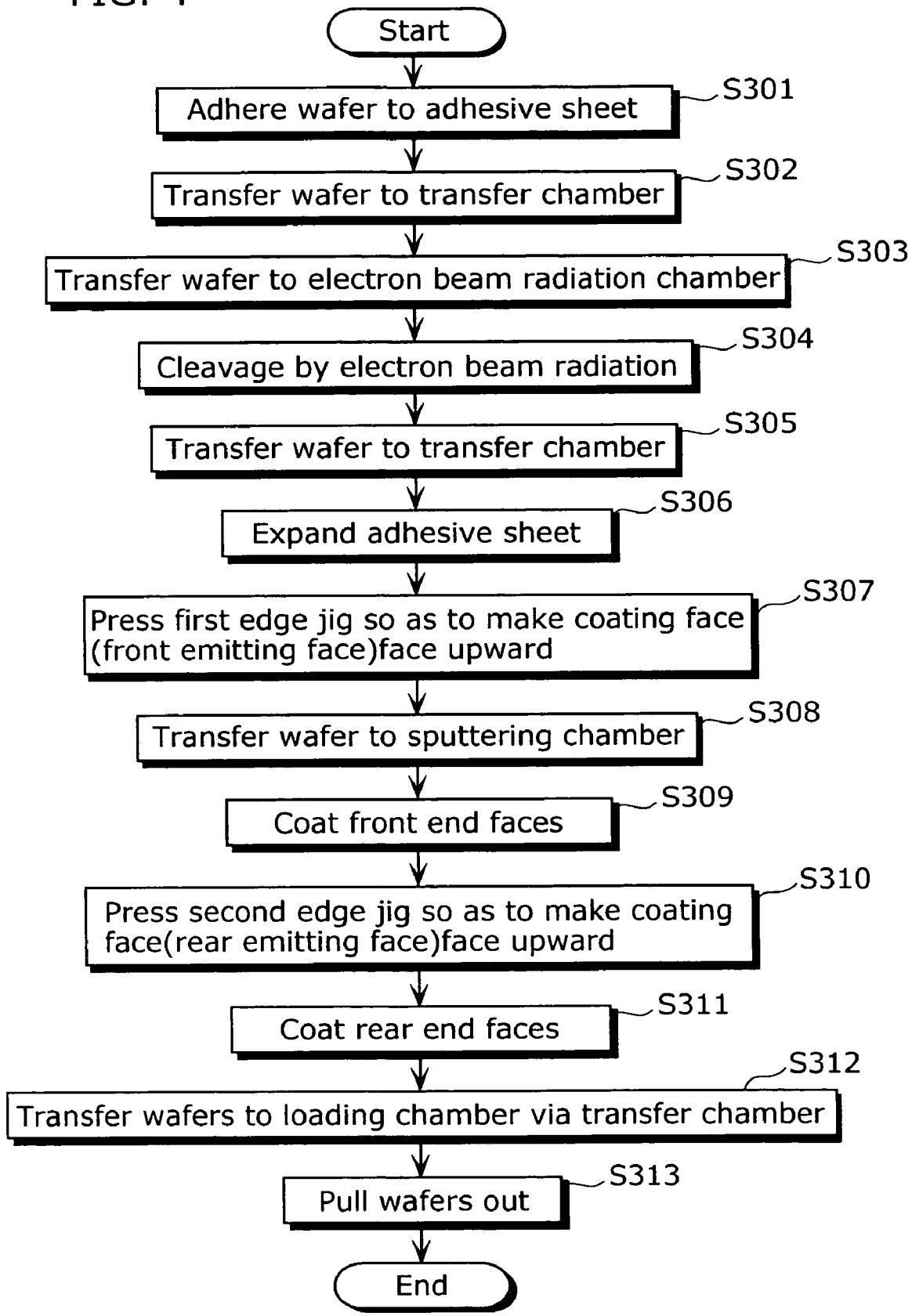

MANUFACTURING METHOD OF SEMICONDUCTOR LASER DEVICES AND MANUFACTURING APPARATUS OF THE SAME

BACKGROUND OF THE INVENTION (1) Field of the Invention

The present invention relates to (a) a method of cutting a substrate on which semiconductor laser devices made of nitride semiconductors and the like are formed and a method of coating the end faces of the cut substrates, and (b) a semiconductor laser device manufacturing apparatus which is capable of executing these methods.

(2) Description of the Related Art

A Group III nitride semiconductor (represented as InGaAlN in general) is expected to be a material capable of realizing a blue violet semiconductor laser device which functions as a light source in a next-generation high-density optical disc. In the research and development stage, the performances of a blue violet laser device made of a GaN system nitride semiconductor has reached the level which satisfies almost all of the specifications of the next generation optical disc system such as a blue ray disc system. At present, the research and development has been carried out continuously and actively in order to realize a high output performance and improve the reliability.

In general, a very hard substrate such as a sapphire substrate and a SiC substrate is used for realizing a crystal growth of a nitride semiconductor. A method of forming a device structure by epitaxially growing a semiconductor layer on the substrate according to the MOCVD (Metal Organic Chemical Vapor Deposition) method is used. In these days, a GaN substrate can be obtained by dividing or removing a thick film crystal which has been grown on the host substrate from the host substrate according to the HVPE (Hydride Vapor Phase Epitaxy) method, and therefore a device structure has been formed on such a GaN substrate. However, in any case, it is very difficult to obtain a planarized cleavage planes which are necessary for forming the resonator mirror of a semiconductor laser device because the substrate is much harder than a conventional semiconductor substrate made of Si, GaAs and the like. Conventionally, line-shaped guides are formed on a substrate made of sapphire, SiC or the like using, for example, a diamond scriber, and the substrate is cleaved by pressing an edge jig on the line-shaped guides. In this case, it is difficult to obtain planarized cleavage planes with a high reproducibility. This increases the threshold current of the resulting semiconductor laser device, and causes the problem of deteriorating the process yield. Here, it is general that a dielectric multi-layer film mirror is coated on each cleavage plane for the purpose of reducing the threshold current by improving the reflectivity of the end face.

Example methods of forming cleavage planes and coating end faces of a conventional nitride semiconductor laser device will be described below (refer to page 122 of "*Wakaru Handotai no Kiso to Ohyo* (Basis and applications of semiconductor laser)", written by Shoji Hirata, published by CQ Press).

FIG. 1 is a flow chart showing methods of forming cleavage planes and coating end faces of conventional nitride semiconductor laser devices.

First, in a so-called cleaving apparatus, straight scribe lines are formed on the back side of a sapphire substrate, the nitride semiconductor wafer is cut into bar-shaped wafers by pressing an edge jig on these scribe lines, and the new end faces of the wafers are exposed so as to form cleavage planes (Step S901). Here, on the sapphire substrate a GaN system semiconductor laser structure has been formed through an epitaxial growth according to, for example, the MOCVD method, and these scribe lines are formed on the back side, on which no epitaxial growth layer has been formed, of the sapphire substrate.

Second, the bar-shaped wafers are loaded on a jig intended for high-frequency (RF: Radio Wave) sputtering in ambient atmosphere (Step S902). Here, the bar-shaped wafers are placed so that so-called front end faces which are the light emitting planes of the semiconductor laser devices face upward.

Third, the bar-shaped wafers loaded on the jig are loaded on an RF sputtering apparatus, and a dielectric coating lamination film such as a $SiO_2/TiO_2$ multi-layer film is formed on one of the end faces, of each wafer, exposed by the cutting of the original wafer (Step S903). In this way, a coating film is deposited on the so-called front end faces which are the light emitting planes.

Forth, the bar-shaped wafers are extracted from the RF sputtering apparatus in ambient atmosphere, turned upside down and reloaded on the jig for RF sputtering so that the so-called rear end faces which are the planes, which do not emit light, of the semiconductor laser device face upward (Step S904).

Fifth, the bar-shaped wafers are loaded on the RF sputtering apparatus again, and a dielectric coating lamination film such as a $SiO_2/TiO_2$ multi-layer film is deposited on the rear end face of each wafer exposed by the cutting of the original wafer (Step S905). In this way, the coating film is deposited on the rear end face of each wafer. Here, the thickness of the dielectric film is determined so that the reflectivity of the front end face becomes approximately 10 percent and the reflectivity of the rear end face becomes approximately 90 percent.

Lastly, the bar-shaped wafers are extracted, and cut into chip-shaped wafers so as to form semiconductor laser devices (Step S906).

SUMMARY OF THE INVENTION

By the way, in the case where there are impurities between the cleavage planes and the coating films of the semiconductor laser devices, the increase in the temperature of the end faces during the operation of the semiconductor laser device triggers the reaction of the impurities with the coating films resulting in forming organic reactants. These reactants deteriorate the light output, and cause a major problem in a sense of securing the reliability of the semiconductor laser devices. Hence, in order to improve the reliability of the semiconductor laser devices, there is a need to reduce the pollution of the cleavage planes before coating the end faces.

However, the conventional methods for forming cleavage planes and coating the end faces to be applied for the nitride semiconductor laser device manufacturing method includes a process of loading the bar-shaped wafers onto a jig in ambient atmosphere before performing the two-stage coating on the end faces. Since the end faces formed by the cleaving are exposed to the ambient atmosphere, organic impurities are inevitably adhered to the end faces formed by the cleaving. Since the end faces are coated in the state that those impurities are adhered to the end faces, additional impurities are easily adhered to the peripheral part of the light emitting planes. Impurities react with the coating films triggered by the increase in the temperature of the end faces during the operation of the semiconductor laser device, and deteriorate the light output of the semiconductor laser devices. Hence, the conventional methods of forming cleavage planes and coating the end faces entail a problem of being incapable of improving the reliability of the semiconductor laser devices.

Therefore, the present invention has been conceived considering the above-described problems. An object of the present invention is to provide a manufacturing method that can be applied to the methods for forming cleavage planes and coating the end faces of the semiconductor laser devices, and thus that is intended for realizing highly reliable semiconductor laser devices.

In order to achieve the above-described object, the manufacturing method of the semiconductor laser device of the present invention includes: cutting a substrate by scanning an electron beam on the front side of the substrate on which a semiconductor laser structure has been formed so as to cause cracks which trigger the cutting of the substrate; and depositing coating films on the end faces, which have been exposed by the cutting of the substrate, of the cut substrates. In the method the cut substrates are transferred in a non-ambient atmosphere at the time between the cutting of the substrate and the depositing of the coating films.

In this way, it becomes possible to transfer the substrate, which has been cut by electron beam radiation in a non-ambient atmosphere and to coat the end faces without polluting the end faces exposed after the cutting, resulting in being capable of preventing organic products from being generated. This result can be obtained because the organic products are generated for the following reason: an increase in the light density of the end faces during the operation of the semiconductor laser device accompanies an increase in heat which transforms the impurities on and around the end faces into organic products. Therefore, it becomes possible to realize highly reliable semiconductor lasers whose devices do not deteriorate. In addition, since the substrate is cut by electron beam radiation, it is possible to planarize the end faces to be formed on, a very hard substrate such as a SiC substrate and a sapphire substrate, or the semiconductor layer formed on one of these substrates easily, with an excellent reproducibility.

Here, in a first aspect of the present invention, in the semiconductor laser device manufacturing method, the non-ambient atmosphere may be a vacuum-evacuated atmosphere. More specifically, the method may include the following. In other words, an electron beam is radiated on the sapphire substrate from the back side of the sapphire substrate in vacuum. On the sapphire substrate the epitaxial growth layer having a semiconductor laser structure has been formed. In this way, the part, which has been heated by the electron beam radiation, of the sapphire substrate has been subjected to thermal expansion, and the lattice constant becomes great. As the result, the sapphire substrate is cleaved because of lattice mismatch, and the cleavage planes to constitute a resonator mirror of the semiconductor laser device are formed. After that, the sample on which cleavage planes have been formed is transferred to a sputtering apparatus or the like in vacuum without being exposed to ambient atmosphere, and the cleavage planes are coated. The front end face (light emitting plane) and the rear end face of the semiconductor laser device are subjected to the two-stage end face coating so that the reflectivity of the rear end face becomes greater than the reflectivity of the front end face.

In this way, it is possible to transfer the substrate cut by electron beam radiation in vacuum and coat the end faces without polluting the end faces which are newly exposed by the cutting. Therefore, it becomes possible to realize a highly reliable semiconductor laser device.

In addition, in a second aspect of the present invention, in the semiconductor laser device manufacturing method, the vacuum-evacuated atmosphere may have been vacuum-evacuated until the degree of vacuum of the atmosphere becomes $1 \times 10^{-3}$ Pa or below.

In this way, it is possible to transfer the substrate cut by the electron beam radiation in the high vacuum of $1 \times 10^{-3}$ Pa or below, and coat the end faces without polluting the end faces which have been newly exposed by the cutting. Thus, it becomes possible to realize the highly reliable semiconductor laser devices.

In addition, in the first aspect of the present invention, in the semiconductor laser device manufacturing method, the non-ambient atmosphere may be an inert gas atmosphere. Further, the method may include the following. First, an electron beam is radiated on the sapphire substrate from the back side of the sapphire substrate in vacuum. On the sapphire substrate the epitaxial growth layer having a semiconductor laser structure has been formed. After that, the sample on which the cleavage planes are formed is transferred through a glove box without being exposed to the atmosphere. Here, the glove box has been previously prepared by, for example, purging $N_2$ so as to reduce $O_2$ or $H_2O$ as much as possible.

In this way, it is possible to transfer the substrate cut by the electron beam radiation in an inert gas atmosphere, and coat the end faces without polluting the end faces which are newly exposed by the cutting. Therefore, it becomes possible to realize the highly reliable semiconductor laser devices.

In addition, in a fourth aspect of the present invention, in the semiconductor laser device manufacturing method, the inert gas atmosphere may contain $O_2$ and $H_2O$ with a concentration of 100 ppm or below.

In this way, it is possible to transfer the substrate cut by the electron beam radiation in the inert gas atmosphere containing $O_2$ and $H_2O$ with a concentration of 100 ppm or below respectively, and coat the end faces which are newly exposed by the cutting without polluting the end faces. Therefore, it becomes possible to realize the highly reliable semiconductor laser devices.

In addition, in the first aspect of the present invention, in the semiconductor laser device manufacturing method, the cutting of the substrate may include cutting of the substrate into bar-shaped substrates by scanning the electron beam on the substrate several times in a way that scanning lines are straight and parallel; and the depositing of the coating films may include depositing of the coating films on the end faces of the cut bar-shaped substrates.

In this way, it is possible to coat the end faces of the chip-shaped substrates regarding as several bar-shaped substrates. Each of the chip-shaped substrates forms a semiconductor laser device. Therefore, it becomes possible to realize the highly reliable semiconductor laser devices and simplify the end face coating process.

In addition, in a sixth aspect of the present invention, the semiconductor laser device manufacturing method may further include: adhering an adhesive sheet to a back side of the substrate, and the back side is to be scanned by the electron beam; and dividing apart the cut bar-shaped substrates by expanding the adhesive sheet. In the method, the depositing of the coating films may further include: causing one of the end faces of each cut bar-shaped substrate to face upward by pressing upwardly the portion of the adhesive sheet which is adhered to the back side of each divided bar-shaped substrate, and the portion is near the end face of each substrate.

In this way, it is possible to cut the substrate and coat the end faces of the cut substrate in a state where they are adhered to the adhesive sheet in the processes of cutting the substrate and coating the end faces as the result of coating process simplification. Therefore, it becomes possible to realize a manufacturing method of the semiconductor laser devices with an excellent volume productivity.

In addition, in a seventh aspect of the present invention, in the semiconductor laser device manufacturing method, the depositing of the coating films may further include sub-depositing of coating films, and the sub-depositing of the coating films may include: causing the opposing end face of each cut bar-shaped substrate to face upward by pressing upwardly the portion of the adhesive sheet which is adhered to the back side of each divided bar-shaped substrate, and the portion is near the opposing end face, of each substrate.

In this way, it is possible to sequentially perform coating of both the front end faces which are the light emitting planes and the rear end faces which are not the light emitting planes of the semiconductor laser devices in a state where they are adhered to the adhesive sheet. Therefore, it becomes possible to realize the semiconductor laser devices whose reflectivities have been much higher in the rear end faces than in the front end faces and which can operate in a low current. In addition, because of process simplification, it becomes possible to realize a manufacturing method of the semiconductor laser devices with an excellent productivity.

In addition, in the coating process, it is possible to place the cut substrates on a jig for fixing in a way that the end faces of the bar-shaped substrates which have been exposed by the cutting of the substrate face upward and deposit coating films on the end faces of the bar-shaped substrates.

In this way, it is possible to cut the substrate and coat the end faces of the substrate in vacuum or in an inert gas atmosphere. Therefore, it becomes possible to realize the highly reliable semiconductor laser devices without polluting the end faces to be coated.

In addition, in the sixth aspect of the present invention, the semiconductor laser device manufacturing method may further include cutting the bar-shaped substrates into chip-shaped substrates by scanning the electron beam on the bar-shaped substrates several times.

In this way, it is possible to cut the substrate into bar-shaped substrates, and sequentially perform processes of coating the end faces and cutting the substrate into chip-shaped substrates each of which forms a semiconductor laser device. Therefore, it becomes possible to realize the highly reliable semiconductor laser devices which cost low but do not include any chipped chips. Further, because of the process simplification, it also becomes possible to realize a semiconductor laser device manufacturing method with an excellent volume productivity.

In addition, in a ninth aspect of the present invention, in the semiconductor laser device manufacturing method, the cutting of the substrate may further include cutting of the bar-shaped substrates into the chip-shaped substrates by scanning the electron beam on the bar-shaped substrates to the direction which is vertical to the longitudinal direction of the bar-shaped substrates.

In this way, it is possible to cut the substrate into rectangle chip-shaped substrates. This improves the handling of these chips in the mounting process which is performed next to the cutting process of the substrate. Therefore, because of process simplification, it becomes possible to realize a manufacturing method of the semiconductor laser devices with an excellent volume productivity.

In addition, in the first aspect of the present invention, in the semiconductor laser device manufacturing method, the cutting of the substrate may include cutting of the substrate by scanning the following electron beam on the substrate: the electron beam whose power density falls within the range from (a) the power density greater than the power density at which one of cracks and dislocations occur in the substrate to (b) the power density smaller than the power density at which the substrate is dissolved.

In this way, the range from the substrate surface to the electron range is heated by the electron beam radiation without being dissolved, the surface part of the substrate is thermally expanded, and the lattice mismatch between the unheated part which is positioned deeper than the electron range and the surface part become greater. Consequently, at the time when the electron range exceeds the critical film thickness, cracks occur in the substrate resulting in cutting the substrate. Therefore, it becomes possible to form planarized cleavage planes without generating any chipped chips.

In addition, in the first aspect of the present invention, the semiconductor laser device manufacturing method may further include depositing metal films on the front side, which is to be scanned by the electron beam, of the substrate.

In this way, the charge-up of the substrate surface occurs, and thus the electron beam does not curve even in the case where the substrate on which the electron beam is to be radiated is insulative. Therefore, it becomes possible to cut the substrate into straight line-shaped substrates.

In addition, in the first aspect of the present invention, in the semiconductor laser device manufacturing method, the depositing of the coating films may include depositing of the coating films according to one of the electron cyclotron resonance sputtering method and the radio frequency sputtering method.

In this way, the end faces can be coated without heating the substrate, unlike the case where the end faces are coated using the chemical vapor deposition or the like. Therefore, even in the example case where the end face coating is performed on the substrate which has been attached to an adhesive sheet, it is possible to perform the end face coating without deteriorating the adhesive sheet resulting in polluting the end faces. Thus, it becomes possible to realize the highly reliable semiconductor laser devices.

In addition, in the first aspect of the present invention, in the semiconductor laser device manufacturing method, the depositing of the coating films may include depositing of the coating films on each end face of the cut substrates by depositing a multi-layer film which is made up of at least two different kinds of films.

In this way, it is possible to form a high reflection mirror on the rear end face of the semiconductor laser device by depositing two types of materials whose total film thickness is a-forth of the optical wavelength and each of which has a different reflectivity. Therefore, it becomes possible to realize the semiconductor laser devices which can operate in a low current and are highly reliable.

In addition, in the first aspect of the present invention, the semiconductor laser device manufacturing method may further include radiating ultraviolet rays on the end faces on which coating films are to be deposited.

In this way, the impurities remaining on the end faces are dissolved and removed by radiating ultraviolet rays on the substrate so as to purify the end faces before its end faces are coated. Therefore, it becomes possible to realize the increasingly reliable semiconductor laser devices.

In addition, in the first aspect of the present invention, in the semiconductor laser device manufacturing method, the substrate may include the part which is made of one of SiC, sapphire, GaN, Si, GaAs and InP.

In this way, it becomes possible to cut a very hard substrate or a semiconductor substrate into stable chip-shaped substrates with few chipped chips. The former includes a SiC substrate and a sapphire substrate, and the latter includes a GaN substrate, a Si substrate, a GaAs substrate and an InP substrate.

In addition, in the first aspect of the present invention, in the semiconductor laser device manufacturing method, the substrate may include a semiconductor layer which is made of InGaAlN.

In this way, it is possible not only to planalize the cleavage planes of the blue violet semiconductor laser device including a light emitting layer of InGaAlN quantum well layer with a high reproducibility but also to coat the cleavage planes without polluting the cleavage planes. Therefore, it becomes possible to realize the highly reliable blue violet semiconductor laser devices.

In addition, the present invention can be realized as a manufacturing apparatus of semiconductor laser devices. The semiconductor laser device manufacturing apparatus includes an electron beam scanning chamber, a coating film deposition chamber and a substrate transfer chamber. The electron beam scanning chamber, of non-ambient atmosphere, includes an electron beam scanning unit for scanning the electron beam on the front side of the substrate on which a semiconductor laser structure has been formed so as to cause cracks which trigger the cutting of the substrate. The coating film deposition chamber, of non-ambient atmosphere, includes a coating unit for depositing coating films on the end faces of the cut substrates, and the end faces have been exposed by the cutting of the substrate. The substrate transfer chamber of non-ambient atmosphere is directly connected to both the electron beam scanning chamber and the coating film deposition chamber, and includes a transfer unit for transferring the cut substrates between the electron beam scanning chamber and the coating film deposition chamber.

In this way, it is possible to transfer the substrate which has been cut by the electron beam radiation in an apparatus of non-ambient atmosphere and coat the end faces without polluting the end faces which have been newly exposed by the cutting. Therefore, it becomes possible to realize a semiconductor laser device manufacturing apparatus which can realize the semiconductor laser devices with improved reliability.

Here, in a nineteenth aspect of the present invention, in the semiconductor laser device manufacturing apparatus, the electron beam scanning chamber, the coating film deposition chamber and the substrate transfer chamber may have been vacuum-evacuated.

In this way, it is possible to transfer the substrate which has been cut by the electron beam radiation in an apparatus where vacuum state is kept and coat the end faces without polluting the end faces which are newly exposed by the cutting. Therefore, it becomes possible to realize a semiconductor laser device manufacturing apparatus which can realize the semiconductor laser devices with improved reliability.

In addition, in a twentieth aspect of the present invention, in the semiconductor laser device manufacturing apparatus, the degrees of vacuum in the atmosphere of the electron beam scanning chamber, the coating film deposition chamber and the substrate transfer chamber may be $1 \times 10^{-3}$ Pa or below respectively.

In this way, it is possible to transfer the substrate which has been cut by the electron beam radiation in the high vacuum of $1 \times 10^{-3}$ Pa and coat the end faces without polluting the end faces which have been newly exposed by the cutting. Therefore, it becomes possible to realize a semiconductor laser device manufacturing apparatus which can realize the semiconductor laser devices with improved reliability.

In addition, the nineteenth aspect of the present invention, in the semiconductor laser device manufacturing apparatus, the electron beam scanning chamber, the coating film deposition chamber and the substrate transfer chamber may be filled with an inert gas atmosphere respectively. Additionally, in a twenty-second aspect of the present invention, in the semiconductor laser device manufacturing apparatus, the substrate transfer chamber may be a glove box which is directly connected both the electron beam scanning chamber and the coating film deposition chamber.

In this way, it is possible to transfer the substrate which has been cut by the electron beam radiation in an apparatus where an inert gas is filled and coat end faces without polluting the end faces which have been newly exposed by the cutting. Therefore, it becomes possible to realize a semiconductor laser device manufacturing apparatus which can realize the semiconductor laser devices with improved reliability.

In addition, in the twenty-second aspect of the present invention, in the semiconductor laser device manufacturing apparatus, the inert gas atmosphere of the electron beam scanning chamber, the coating film deposition chamber and the substrate transfer chamber may contain $O_2$ and $H_2O$ with a concentration of 100 ppm or below respectively.

In this way, it is possible to transfer the substrate which has been cut by the electron beam radiation in the inert gas atmosphere containing $O_2$ and $H_2O$ with a concentration of 100 ppm or below respectively and coat the end faces without polluting the end faces which have been newly exposed by the cutting. Therefore, it becomes possible to realize a semiconductor laser device manufacturing apparatus which can realize the semiconductor laser devices with improved reliability.

Further, the semiconductor laser device manufacturing apparatus may be adhered to the back side of the substrate which are not to be scanned by the electron beam. Additionally, the manufacturing apparatus may include an adhesive sheet for dividing apart the cut substrates on the adhesive sheet by expanding the adhesive sheet and an edge jig which makes one of the end faces of each substrate exposed by the cutting face upward by pressing the portion of the adhesive sheet which is adhered to the back side of each divided substrate.

In this way, it is possible to cut the substrate and coat the end faces in a state where the substrates are adhered to the adhesive sheet in the processes of cutting and end face coating. Therefore, because of process simplification, it becomes possible to realize a semiconductor laser device manufacturing apparatus with an excellent volume productivity.

In addition, in the nineteenth aspect of the present invention, the semiconductor laser device manufacturing apparatus may further include a jig for fixing which is used for fixing each substrate in a way that one of the end faces of each substrate faces upward.

In this way, it is possible to cut the substrate and coat the end faces in vacuum or in an inert gas atmosphere. Therefore, it becomes possible to realize a semiconductor laser device manufacturing apparatus which can improve the reliability of the semiconductor laser devices without polluting the end faces which have been exposed by the cutting.

In addition, in the nineteenth aspect of the present invention, in the semiconductor laser device manufacturing apparatus, the coating unit may be intended for depositing the coating films according to one of the electron cyclotron resonance sputtering method and the radio frequency sputtering method.

In this way, it is possible to coat the end faces without heating the substrate unlike the case where the end faces are coated using the chemical vapor deposition. Therefore, even in the example case where end face coating is performed on the substrate which has been adhered to an adhesive sheet, it is possible to perform the end face coating without deteriorating the adhesive sheet resulting in polluting the end faces. Therefore, it becomes possible to realize the semiconductor laser device manufacturing apparatus which can improve the reliability of the semiconductor laser devices.

In addition, in the nineteenth aspect of the present invention, the semiconductor laser device manufacturing apparatus may further include an ultraviolet ray radiation unit intended for radiating ultraviolet rays on the end faces, of the substrates, on which coating films are to be deposited.

In this way, the impurities remaining on the end faces are dissolved and removed by radiating ultraviolet rays on the substrate so as to purify the end faces before its end faces are coated. Therefore, it becomes possible to realize a semiconductor laser device manufacturing apparatus which can further improve the reliability of the semiconductor laser devices.

As described up to this point, according to the semiconductor laser device manufacturing method of the present invention, it becomes possible to planarize the cleavage planes realizing an excellent productivity and coat the end faces by transferring the wafers without polluting the cleaved planes. Therefore, it becomes possible to realize nitride semiconductor laser devices, which are formed on a hard material such as a sapphire substrate and a SiC substrate, which can operate in a low current, and can have a high output and improved reliability.

Therefore, the present invention enables to provide a semiconductor laser device manufacturing method for realizing high performance semiconductor laser devices, and thus the present invention is highly practical.

FURTHER INFORMATION ABOUT TECHNICAL BACKGROUND TO THIS APPLICATION

The disclosure of Japanese Patent Application No. 2004-340753 filed on Nov. 25, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 4 is a flow chart showing the details of the wafer cleaving process and the end face coating process in which the semiconductor laser device manufacturing apparatus of the first embodiment is used;

DESCRIPTION OF THE PREFERRED EMBODIMENT(S)

The manufacturing method of the semiconductor laser device in the embodiments of the present invention will be described with reference to figures.

First Embodiment

Figure 1:
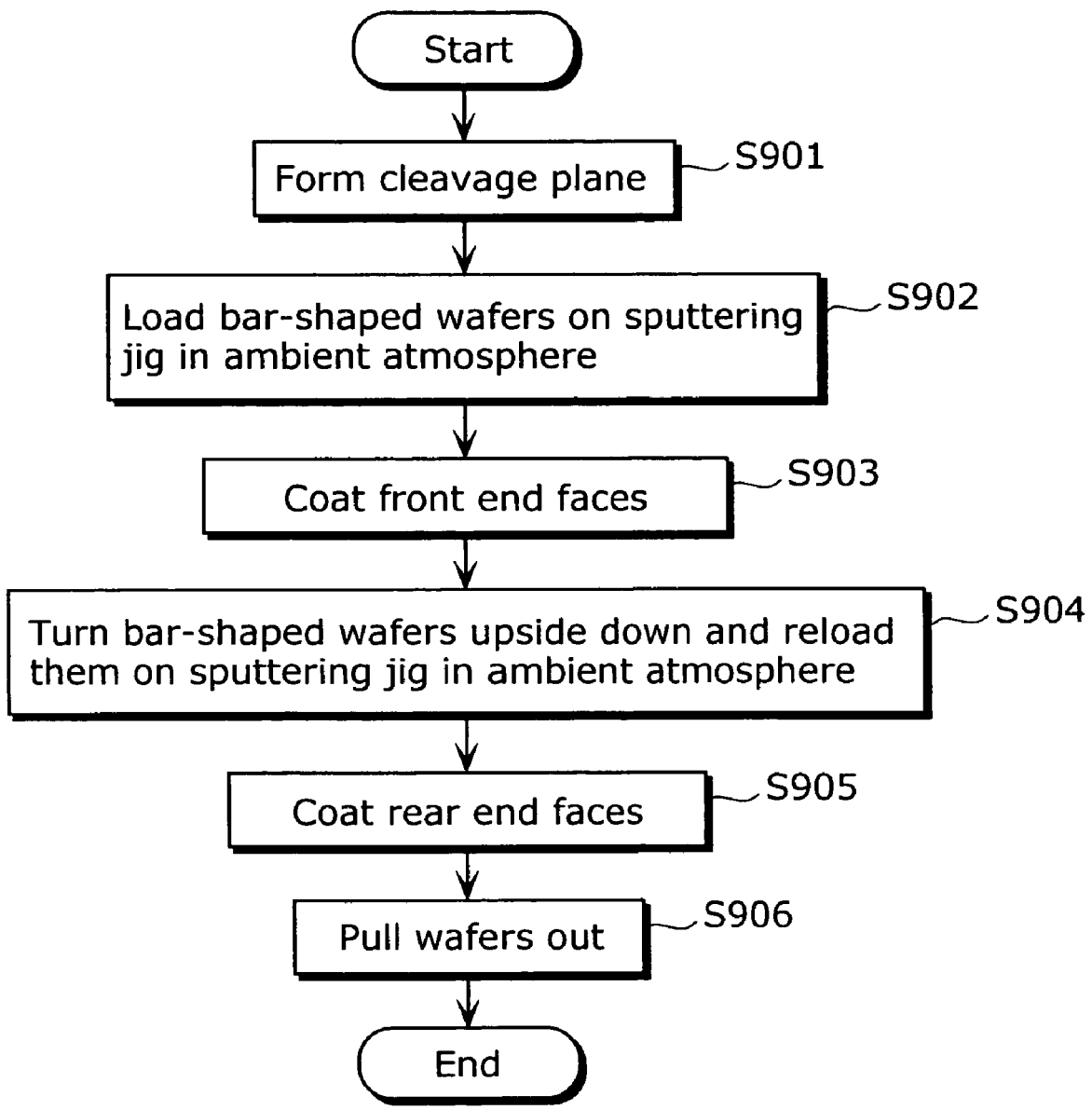
FIG. 1 is a flow chart showing a cleaving method of a wafer and a coating method of the end faces of the wafers in a manufacturing method of conventional nitride semiconductor laser devices.
Figure 2:
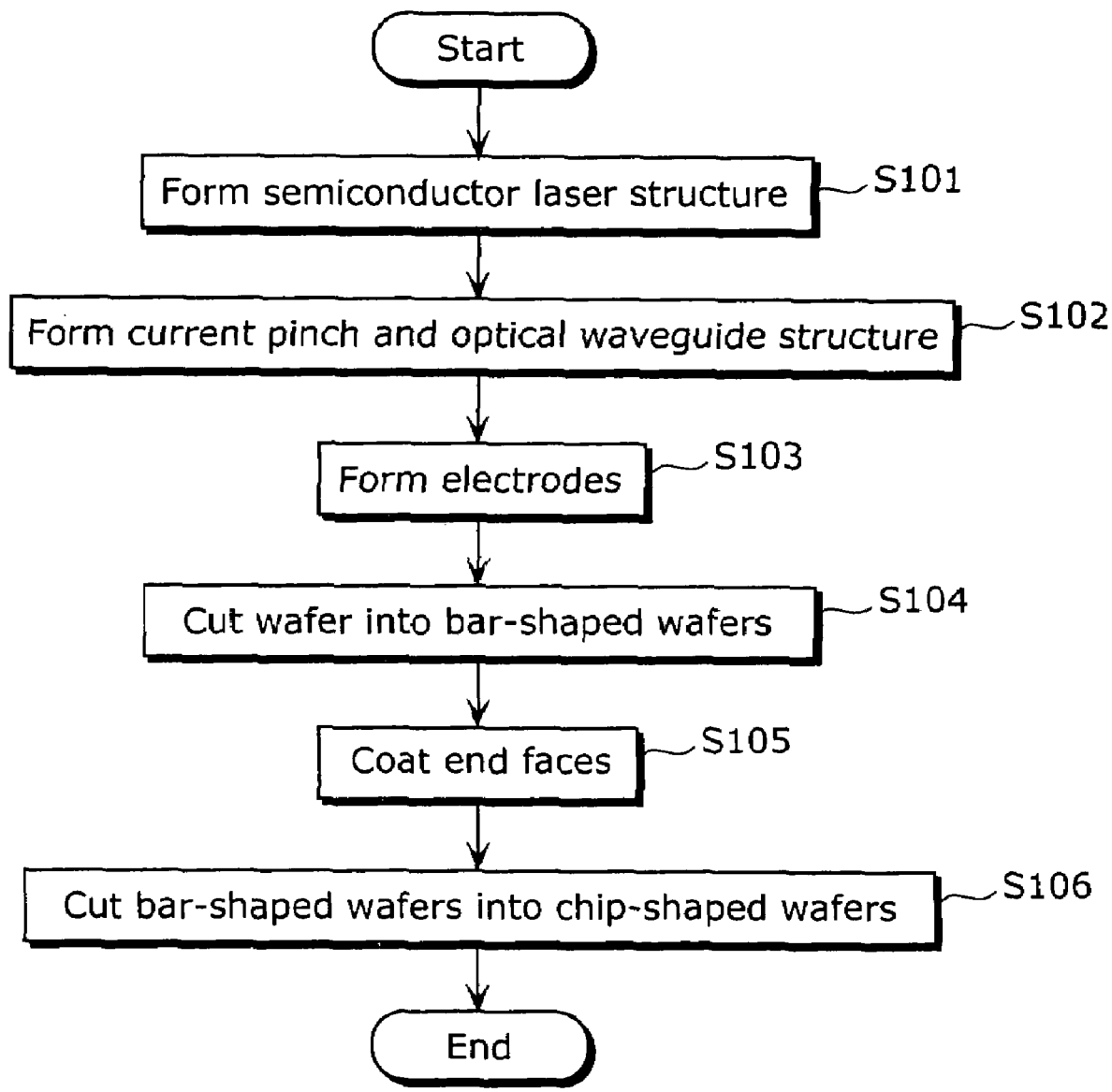
FIG. 2 is a flow chart showing a manufacturing method of the semiconductor laser devices of a first embodiment of the present invention.

FIG. 2 is a flow chart showing the manufacturing method of the semiconductor laser devices of a first embodiment.

First, a semiconductor laser structure which oscillates a blue-violet laser is formed by epitaxially growing a semiconductor layer made of InGaAlN on a sapphire substrate according to, for example, the MOCVD method (Step S101). At this time, the epitaxially grown layer is formed by sequentially stacking the following layers: an undoped GaN ground layer; an n-type GaN ground layer; an n-type AlGaN cladding layer; an n-type GaN guide layer; an InGaN multi-quantum well active layer; a p-type AlGaN electron barrier layer; a p-type GaN guide layer; a p-type AlGaN cladding layer; and a $p^+$-type GaN contact layer.

Second, a stripe-shaped ridge part is formed on the epitaxially grown layer using a well-known lithography technique.

Third, dielectric layers or block layers are formed at both sides of the ridge parts so as to cause a current pinch and form an optical waveguide structure (Step S102).

Forth, a p-type electrode is formed on the $p^+$-type GaN contact layer of the surface of the epitaxially grown layer and an n-type electrode is formed on the n-type AlGaN cladding layer which has been exposed by selectively etching the active layer and the p-type layer (Step S103). In this way, a substrate on which a blue violet semiconductor laser structure is formed, that is, a nitride semiconductor wafer is formed.

Fifth, the wafer is cut into bar-shaped wafers using the electron beam so as to expose new wafer end faces which are the cleavage planes (Step S104).

Sixth, coating films are deposited on the end faces exposed by the cutting (Step S105).

Lastly, the bar-shaped wafers are cut into chip-shaped wafers using the electron beam (Step S106). In this way, semiconductor laser devices are formed.

Next, the wafer cleaving process and the end face coating process shown in Steps S104 and S105 will be described below in detail.

Figure 3:
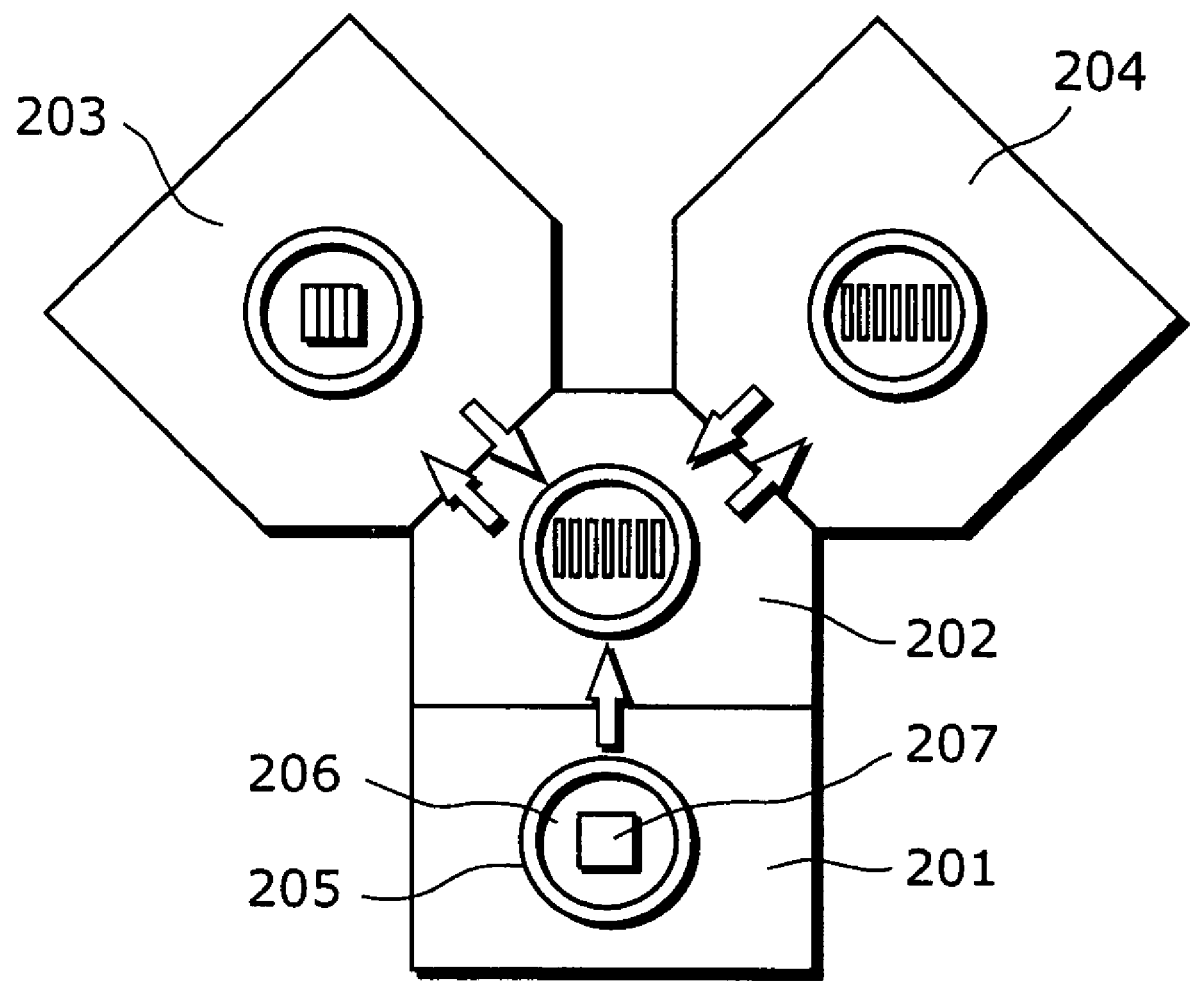
FIG. 3 is a schematic diagram showing the configuration of the semiconductor laser device manufacturing apparatus which are used in the wafer cleaving process and in the end face coating process of the manufacturing process of the semiconductor laser devices of the first embodiment.

FIG. 3 is a schematic diagram showing the configuration of the semiconductor laser device manufacturing apparatus which is used in the wafer cleaving process and the end face coating process.

The semiconductor laser device manufacturing apparatus is made up of: a loading chamber 201; a transfer chamber 202; an electron beam radiation chamber 203; a sputtering chamber 204; a jig 205; and an adhesive sheet 206.

The transfer chamber 202 is directly connected to both the electron beam radiation chamber 203 and the sputtering chamber 204, and has a transfer unit which transfers the wafer 207 between the electron beam radiation chamber 203 and the sputtering chamber 204. Here, the transfer chamber 202 is the chamber of non-ambient atmosphere, and the pressure inside the chamber is always kept at $1 \times 10^{-3}$ Pa or below, for example, approximately $1 \times 10^{-4}$ Pa.

The electron beam radiation chamber 203 has an electron beam scanning unit which scans the following electron beam on the wafer 207: the electron beam whose power density falls within the range (a) from the power density greater than the power density at which cracks or dislocations start to occur in the wafer 207 (b) to the power density smaller than the power density at which the wafer 207 is dissolved. Here, the electron beam radiation chamber 203 is the chamber of non-ambient atmosphere during the time when the wafer 207 is transferred from the transfer chamber 202. In other words, the electron beam radiation chamber 203 is vacuum-evacuated until the degree of vacuum becomes approximately the same as the degree of vacuum of the transfer chamber 202.

The sputtering chamber 204 has one of an ECR (Electron Cyclotron Resonance) sputtering apparatus and an RF sputtering apparatus which are sputtering units for depositing coating films on the cleavage planes. Here, the sputtering chamber 204 is the chamber of non-ambient atmosphere during the time when the wafer 207 is transferred from the transfer chamber 202. In other words, the sputtering chamber 204 is vacuum-evacuated until the degree of vacuum becomes approximately the same as the degree of vacuum of the transfer chamber 202.

FIG. 4 is a flow chart showing the details of the cleaving process of the wafer 207 and the coating process of the end faces, and in both of the processes the semiconductor laser device manufacturing apparatus is used. In addition, FIG. 5A to 5H are sectional views of the substrate and are for illustrating the details of the cleaving process of the wafer 207 and the coating process of the end faces, and in both of the processes the semiconductor laser device manufacturing apparatus of the first embodiment is used.

Figure 5A:
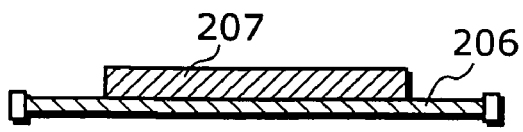
FIG. 5A to 5H are sectional views of the substrate and are for illustrating the details of the wafer cleaving process and the end face coating process in which the semiconductor laser device manufacturing apparatus of the first embodiment is used.

First, the sapphire substrate of the wafer 207 is polished until the film is slimmed down to, for example, approximately 100 μm, and then a Au thin film of approximately 10 nm is deposited on the back side of the sapphire substrate with no epitaxially grown layer. After that, as shown in FIG. 5A, the wafer 207 and the adhesive sheet 206 are adhered to each other so that its back side of the sapphire substrate faces upward in a way that the epitaxially grown layer which is not to be scanned by an electron beam is placed in contact with the adhesive sheet 206. After that, the wafer 207 to which the adhesive sheet 206 is adhered is loaded on the jig 205 so that the adhesive sheet 206 can be expanded. (Step S301).

Second, the jig 205 on which the wafer 207 has been loaded is loaded into the loading chamber 201, and then the loading chamber 201 is vacuum-evacuated until the pressure inside the chamber decreases to $1 \times 10^{-3}$ Pa or below, for example, approximately $1 \times 10^{-4}$ Pa using a vacuum pump (if possible, the atmosphere of the loading chamber is purified as much as possible by performing $N_2$ gas replacement for several times).

After that, a gate bulb placed between the transfer chamber 202 and the loading chamber 201 is opened, and the jig 205 on which the wafer 207 has been loaded is transferred to the transfer chamber 202 (Step S302).

Third, the gate bulb placed between the transfer chamber 202 and the loading chamber 201 is shut, and a gate bulb placed between the electron beam radiation chamber 203 and the transfer chamber 202 is opened. Before this gate bulb is opened, the electron beam radiation chamber 203 is previously vacuum-evacuated until the degree of vacuum inside the electron beam radiation chamber 203 becomes approximately the same as the degree of vacuum of the transfer chamber 202. After that, the jig 205 on which the wafer 207 has been loaded is transferred to the electron beam radiation chamber 203 (Step S303).

Figure 5B:
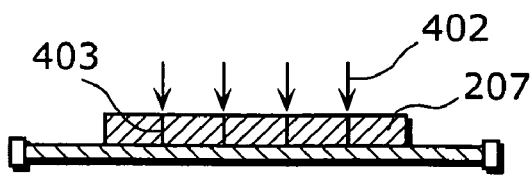
Figure 6:
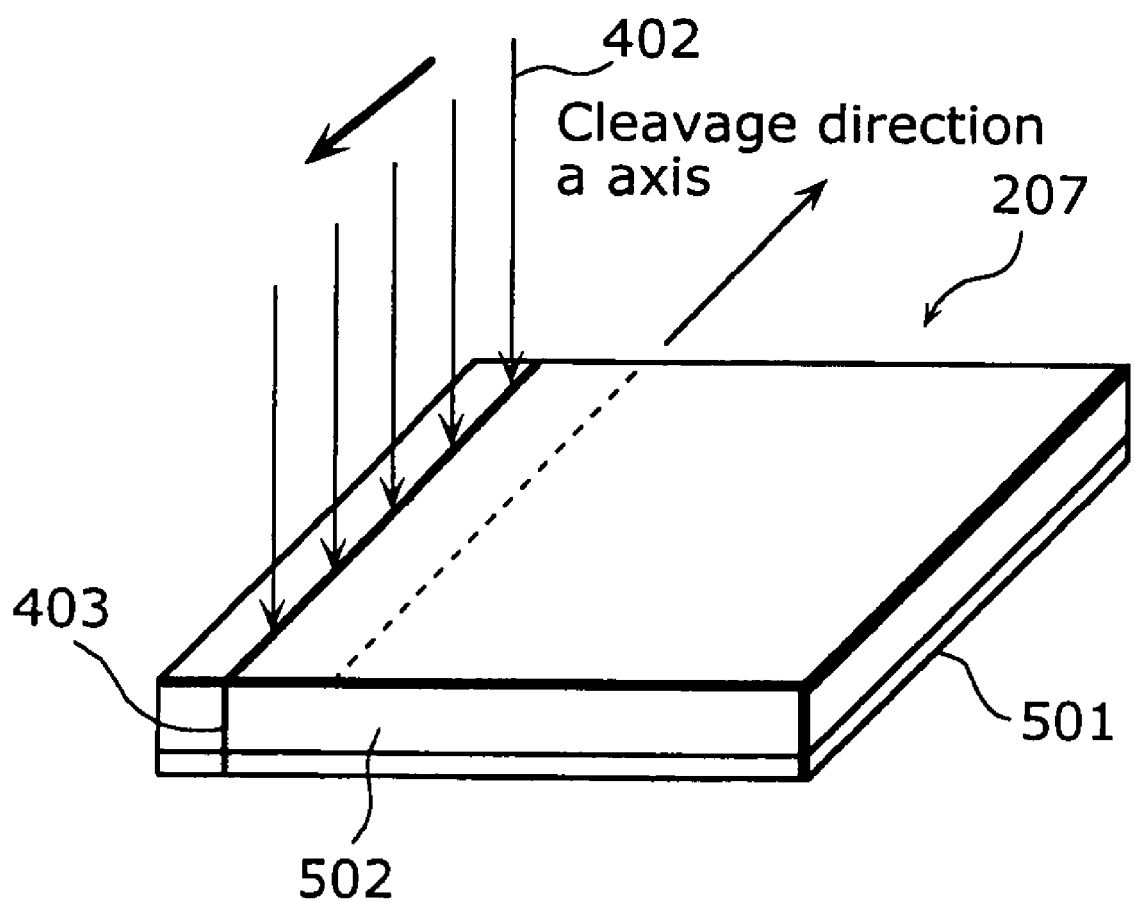
FIG. 6 is a diagram for illustrating the wafer cleaving by an electron beam radiation in the semiconductor laser device manufacturing process of the first embodiment.

Forth, as shown in FIG. 5B, cracks are generated by scanning the electron beam 402 on the wafer 207, and the wafer 207 is cut into bar-shaped wafers so as to form the cleavage planes 403, which are the end faces of the wafer 207, which are newly exposed by the cutting (Step S304). At this time, as shown in FIG. 6, scanning of the electron beam 402 on the wafer 207 is performed by scanning the electron beam 402 on the back side, with no epitaxially grown layer 501, of the sapphire substrate 502 several times in a way that scanning lines are straight and parallel. In addition, the occurrence of cracks stems from heating and cooling down the surface of the wafer 207 in a short time by the radiation of the electron beam 402. In other words, the sapphire substrate has been heated in the range to which the electron beam 402 reaches from the surface of the sapphire substrate, resulting in causing lattice expansion of the substrate. This lattice expansion results in causing a lattice mismatch between the electron range of the electron beam 402 and the part positioned below the electron range. This causes dislocations resulting in cracks.

Fifth, after the wafer 207 is cut into bar-shaped wafers, the jig 205 on which the wafers 207 has been loaded are transferred to the transfer chamber 202 (Step S305).

Figure 5C:
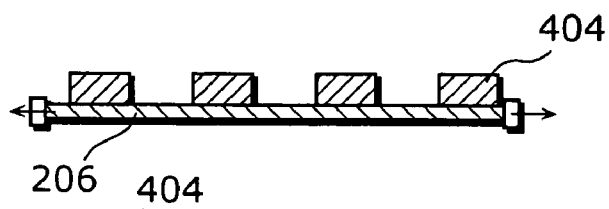

Sixth, as shown in FIG. 5C, the adhesive sheet 206 is expanded on the jig 205, and the bar-shaped wafers 404 are divided (Step S306).

Figure 5D:

Seventh, as shown in FIG. 5D, a first edge jig 405 is made contact with the jig 205 in a way that the first edge jig 405 is pressed upwardly, from below the adhesive sheet 206, on the bar-shaped wafers 404 on the adhesive sheet, so that the bar-shaped wafers 404 are placed on the jig 205 in a way that the so-called front end faces which are the light emitting planes of the semiconductor laser device face upward (Step S307). In this way, it becomes possible to perform end face coating of the front end faces. At this time, the first edge jig 405 is pressed on one of the sides of the cleavage plane 403 of each bar-shaped wafer 404 on the adhesive sheet 206, that is, on the front end face sides of the semiconductor laser devices. In addition, the first edge jig 405 is made contact with the jig 205 in a way that the opposing cleavage planes 403 which face downward are not in contact with the adhesive sheet 206.

Eighth, the jig 205 on which the bar-shaped wafers 404 are loaded are transferred from the transfer chamber 202 to the sputtering chamber 204 (Step S308). Before the transfer of the jig 205, the sputtering chamber 204 has been vacuum-evacuated until the degree of vacuum of the sputtering chamber 204 becomes approximately the same as the degree of vacuum of the transfer chamber 202 like the case of the earlier described transfer of the jig 205 to the electron beam radiation chamber 203.

Figure 5E:
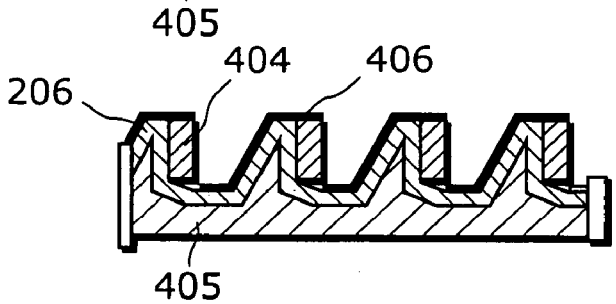

Ninth, as shown in FIG. 5E, coating of front end faces of the cleavage planes 403 of the bar-shaped wafers 404 which face upward is performed so that the front end face reflectivities of the semiconductor laser devices become approximately 5 percent, using the ECR sputtering method or the like. In this way, front coating films 406 made of $SiO_2$ film of 70 nm or the like are deposited (Step S309). At this time, as a sputtering target, $SiO_2$, $TiO_2$, a-Si:H or the like is used.

Figure 5F:
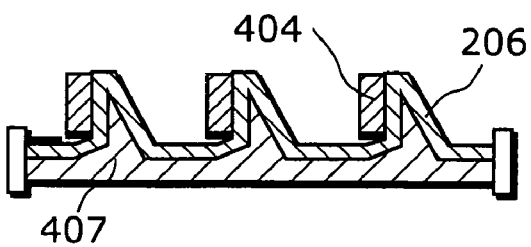

Tenth, the jig 205 on which the bar-shaped wafers 404 have been loaded are transferred to the transfer chamber 202 once again, and the first edge jig 405 is extracted from the jig 205. After that, as shown in FIG. 5F, a second edge jig 407 is made contact with the jig 205 in a way that the second edge jig 407 is pressed upwardly, from below the adhesive sheet 206, on the bar-shaped wafers 404 on the adhesive sheet, so that the bar-shaped wafers 404 are placed on the jig 205 in a way that the so-called back end faces which are the planes, which do not emit light, of the semiconductor laser devices face upward (Step S310). In this way, it becomes possible to perform end face coating of the back end faces of the semiconductor laser devices. At this time, the second edge jig 407 is pressed on one of the sides of the cleavage plane 403 of each bar-shaped wafer 404 on the adhesive sheet 206, that is, on the back end face sides of the semiconductor laser devices. In addition, the second edge jig 407 is made contact with the jig 205 in a way that the other cleavage planes 403 which face downward are not in contact with the adhesive sheet 206.

Figure 5G:
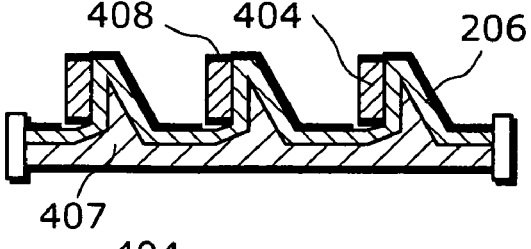
Figure 5H:
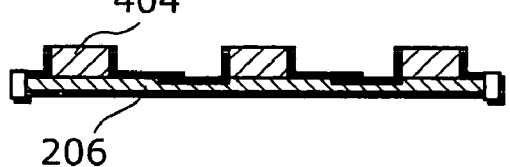

Eleventh, the jig 205 on which the bar-shaped wafers 404 have been loaded are transferred from the transfer chamber 202 to the sputtering chamber 204 once again. After that, as shown in FIG. 5G, coating of the back end faces, which are the cleavage planes 403, of the bar-shaped wafers 404 which face upward is performed so that the back end face reflectivities of the semiconductor laser devices become, for example, approximately 90 percent, using the ECR sputtering method or the like, like in the case of front end face coating. In this way, back coating films 408, which are the multi-layers obtained by laminating films such as $SiO_2$ film of 70 nm and $TiO_2$ film of 35 nm twice, are deposited (Step S311).

Twelfth, after the sputtering is completed, the bar-shaped wafers 404, with coated front and back end faces, which are the cleavage planes, of the semiconductor laser devices are transferred to the loading chamber 201 which is a high vacuum chamber via the transfer chamber 202 (Step S312).

Lastly, after the gate bulb placed between the loading chamber 201 and the transfer chamber 202 is shut, $N_2$ is purged in the loading chamber 201 until the pressure inside the loading chamber 201 returns to the pressure equal to the ambient atmosphere. After that, the bar-shaped wafers 404 are extracted in a state shown in FIG. 5H (Step S313).

Note that, in the case of performing the so-called second cleaving of the bar-shaped wafers 404 in order to further cut them into chip-shaped wafers, they are cut into chip-shaped wafers in the following way after the process shown in Step S311: transferring the bar-shaped wafers 404 to the electron beam radiation chamber 203 once again via the transfer chamber 202; and scanning the electron beam 402 on the bar-shaped wafers 404 several times towards the direction which is vertical to the already formed cleavage planes, that is, the direction which is vertical to the longitudinal direction of the bar-shaped wafers 404. After that, the chip-shaped wafers are transferred to the transfer chamber 202, the adhesive sheet 206 is expanded once again, and the respective chip-shaped wafers are divided apart. After that, the chip-shaped wafers are transferred to the loading chamber 201 and then extracted.

As described up to this point, with the manufacturing method of the semiconductor laser devices of this embodiment, it is possible to perform end face coating without exposing the cleavage planes to the ambient atmosphere, more specifically, for example, without forming impurities such as organic impurities on the cleavage planes, especially, on the light emitting parts. Therefore, the heating of the end faces do not cause the impurities to react with one of the GaN system semiconductors contained in the semiconductor laser devices and the coating films during the operation of the semiconductor laser devices, resulting in formation of organic reactive products. Thus, this semiconductor laser device manufacturing method of this embodiment does not cause a reliability-related problem such as a deterioration in light output power, and thus this method enables to realize the highly reliable semiconductor laser devices.

In addition, since a wafer is cleaved using an electron beam in the manufacturing method of the semiconductor laser devices of this embodiment, it is possible to form planarized cleavage planes with an excellent productivity.

Second Embodiment

The manufacturing method of semiconductor laser devices in a second embodiment is basically similar to the manufacturing method of semiconductor laser devices in the first embodiment in that a wafer is cleaved by an electron beam radiation and then its end faces are coated in sequence without being exposed to ambient atmosphere, in the wafer cleaving process and the end face coating process. However, the manufacturing method of semiconductor laser devices in the second embodiment is different from the manufacturing method of semiconductor laser devices in the first embodiment in that wafers are transferred through a glove box filled with $N_2$ gas or the like instead of being transferred through a transfer chamber where high vacuum is kept. The different point from the manufacturing method of the semiconductor laser devices of the first embodiment will be focused on in the following description.

Figure 7:
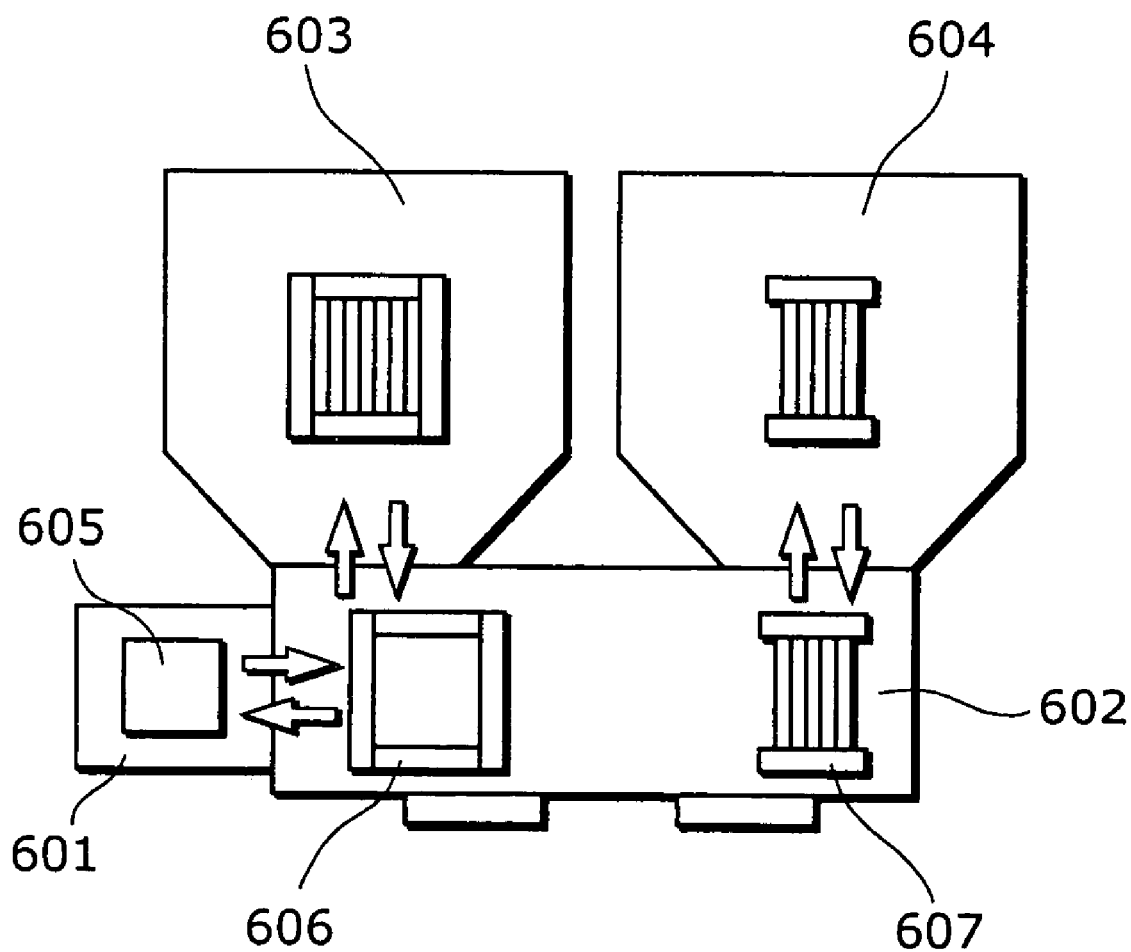
FIG. 7 is a schematic diagram showing the configuration of the semiconductor laser device manufacturing apparatus which is used in the wafer cleaving process and in the end face coating process of the semiconductor laser device manufacturing process in a second embodiment of the present invention.

FIG. 7 is a schematic diagram showing the configuration of the semiconductor laser device manufacturing apparatus which is used in the wafer cleaving process and the end face coating process of the manufacturing method of the semiconductor laser devices in the second embodiment.

The semiconductor laser device manufacturing apparatus includes: a loading chamber 601; a glove box 602; an electron beam radiation chamber 603; a sputtering chamber 604; a jig for cleaving 606; and a jig for sputtering 607.

The pressure inside the glove box 602 is kept at the same level of pressure as the ambient atmosphere. The glove box 602 is directly connected to both the electron beam radiation chamber 603 and the sputtering chamber 604, and includes a transfer unit which transfers the wafer 605 between the electron beam radiation chamber 603 and the sputtering chamber 604. Here, the glove box 602 is a chamber of non-ambient atmosphere. The glove box 602 is filled with a pure inert gas atmosphere which does not contain oxygen and vapor but contains $O_2$ and $H_2O$ with a concentration of 100 ppm or below respectively. For example, the inert gas atmosphere which has been purged using $N_2$ gas is always kept in the glove box 602.

The electron beam radiation chamber 603 has an electron beam scanning unit which scans the following electron beam on the wafer 605: the electron beam whose power density falls within the range of (a) from the power density greater than the power density at which cracks or dislocations start to occur in the wafer 605 (b) to the power density smaller than the power density at which the wafer 605 is dissolved. Here, the electron beam radiation chamber 603 is the chamber of non-ambient atmosphere during the time when the wafer 605 is transferred from the glove box 602. In other words, an inert gas such as $N_2$ gas is filled into the chamber until the concentration degrees of oxygen and vapor become the same as the concentration degrees in the glove box 602.

The sputtering chamber 604 has one of an ECR sputtering apparatus and an RF sputtering apparatus which are sputtering units for depositing coating films on the cleavage planes. Here, the sputtering chamber 604 is a chamber of non-ambient atmosphere during the time when the wafer 605 is transferred from the glove box 602. In other words, an inert gas such as $N_2$ gas is filled into the chamber until the concentration degrees of oxygen and vapor become the same as the concentration degrees in the glove box 602.

The jig for cleaving 606 presses the wafer 605 in the horizontal direction by sandwiching the wafer 605 so that the wafer 605 is not transferred after the cleaving by electron beam radiation.

The jig for sputtering 607 presses the wafer 605 in the horizontal direction by sandwiching the wafer 605 so that the wafer 605 is not transferred at the time of performing end face coating.

Figure 8:
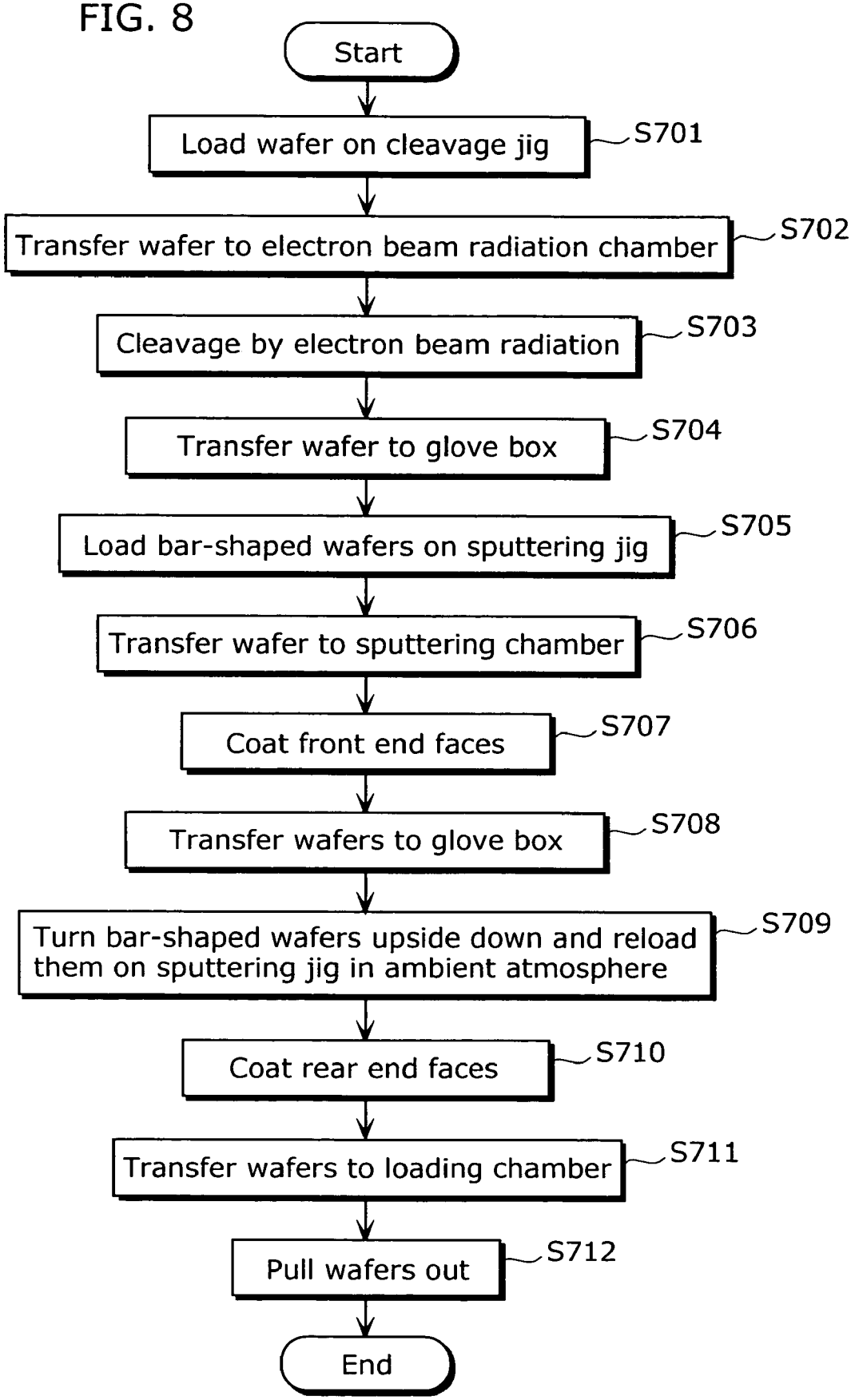
FIG. 8 is a flow chart showing the details of the wafer cleaving process and the end face coating process in which the semiconductor laser device manufacturing apparatus of the second embodiment is used.

FIG. 8 is a flow chart showing the details of the cleaving process of the wafer 605 and the end face coating process of its cleavage planes in which the above-described semiconductor laser device manufacturing apparatus is used. Additionally, FIG. 9A to 9F are section views for illustrating the details of the cleaving process of the wafer 605 and the end face coating process of its cleavage planes in which the above-described semiconductor laser device manufacturing apparatus is used.

Figure 9A:
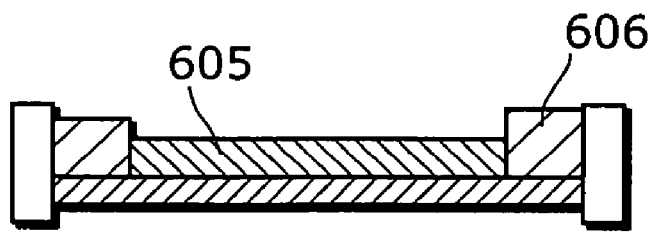
FIG. 9A to 9F are sectional views of the substrate and are for illustrating the details of the wafer cleaving process and the end face coating process in which the semiconductor laser device manufacturing apparatus of the second embodiment is used

First, the sapphire substrate of the wafer 605 is polished until the film is slimed down to, for example, approximately 100 μm, and then a Au thin film of approximately 10 nm is deposited on the back side, without no epitaxially grown layer, of the sapphire substrate. After that, the wafer 605 is loaded into the loading chamber 601, the loading chamber 601 is vacuum-evacuated using a vacuum pump, $N_2$ gas replacement is performed several times, and the wafers 605 is transferred to the glove box 602 filled with $N_2$ gas. After that, a gate bulb placed between the glove box 602 and the loading chamber 601 is shut, and then, as shown in FIG. 9A, the wafer 605 is loaded on the jig for cleaving 606 in the glove box 602 (Step S701).

Second, the gate bulb placed between the electron beam radiation chamber 603 and the glove box 602 is opened, and the jig for cleaving 606 on which the wafer 605 has been loaded is transferred to the electron beam radiation chamber 603 so as to be set on the position at which the electron beam is to be radiated. Before this gate bulb is opened, $N_2$ gas is previously filled into the electron beam radiation chamber 603 until the pressure inside the electron beam radiation chamber 603 becomes approximately the same pressure as the ambient atmosphere. After that, the gate bulb placed between the electron beam radiation chamber 603 and the glove box 602 is shut, and then the electron beam radiation chamber 603 is vacuum-evacuated (Step S702).

Figure 9B:
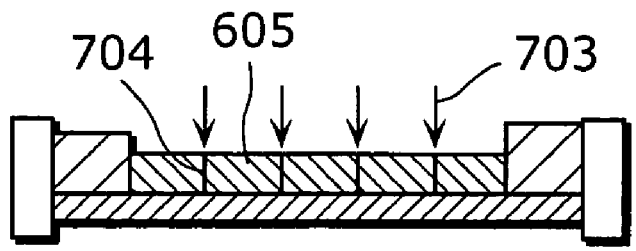

Third, as shown in FIG. 9B, the wafer 605 is scanned by the electron beam 703 so as to cause cracks, and the wafer 605 is cut into bar-shaped wafers so as to form cleavage planes 704, which are the end faces of the wafers 605, which are newly exposed by the cutting (Step S703). At this time, scanning of the electron beam 703 on the wafer 605 is performed by scanning the electron beam 703 on the back side of the sapphire substrate several times in a way that scanning lines are straight and parallel. This radiation of electron beam 703 cuts the wafer 605 by the scanned lines at which the electron beam 703 is radiated like in the case of the first embodiment.

Forth, after the wafer 605 is cut into bar-shaped wafers, $N_2$ gas is previously filled into the electron beam radiation chamber 603 until the pressure inside the electron beam radiation chamber 603 becomes approximately the same pressure as the ambient atmosphere, and then the jig for cleaving 606 on which the wafers 605 are loaded is transferred to the glove box 602 (Step S704).

Figure 9C:
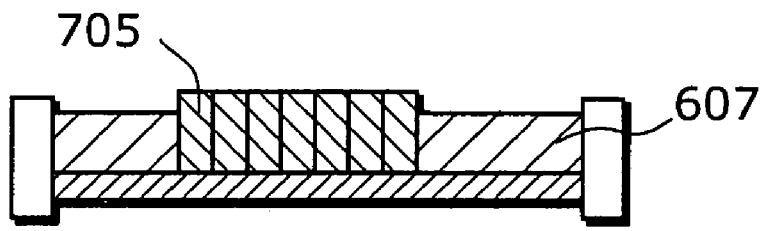

Fifth, in the glove box 602 the bar-shaped wafers are extracted from the jig for cleaving 606 so as to be divided apart. After that, as shown in FIG. 9C, the bar-shaped wafers 705 are loaded on the jig for sputtering 607 (Step S705). At this time, the bar-shaped wafers 705 are loaded on the jig for sputtering 607 so that their so-called front end faces, which are the light emitting planes, of the semiconductor laser devices face upward. In this way, it becomes possible to perform front end face coating.

Sixth, the gate bulb placed between the glove box 602 and the sputtering chamber 604 is opened, and the jig for sputtering 607 on which the bar-shaped wafers 705 are loaded is transferred from the glove box 602 to the sputtering chamber 604. At this time, like in the earlier case where the wafers are transferred to the electron beam radiation chamber 603, $N_2$ gas is further filled into the sputtering chamber 604 until the pressure inside the sputtering chamber 604 becomes approximately the same pressure as the ambient atmosphere before the jig for sputtering 607 is transferred. After that, the gate bulb placed between the glove box 602 and the sputtering chamber 604 is shut and the sputtering chamber 604 is vacuum-evacuated (Step S706).

Figure 9D:
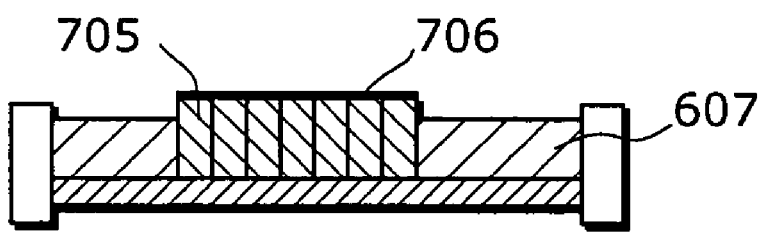

Seventh, as shown in FIG. 9D, coating of the front end faces, which are the cleavage planes 704, of the bar-shaped wafers 705 which face upward is performed so that the front end face reflectivities of the semiconductor laser devices become approximately 5 percent, using the ECR sputtering method or the like. In this way, front coating films 706 made of $SiO_2$ film of 70 nm or the like are deposited (Step S707).

Eighth, the jig for sputtering 607 on which the bar-shaped wafers 705 are loaded is transferred to the glove box 602 once again (Step S708).

Figure 9E:
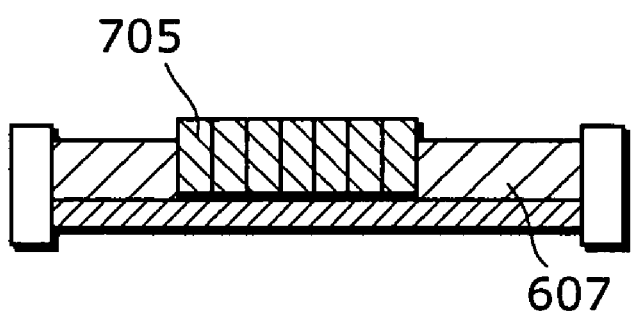

Ninth, as shown in FIG. 9E, the bar-shaped wafers 705 are placed on the jig for sputtering 607 so that their back end faces, which do not emit light, of the semiconductor laser devices face upward (Step S709). In this way, it becomes possible to perform coating of the back end faces, with no coating films, of the semiconductor laser devices.

Figure 9F:
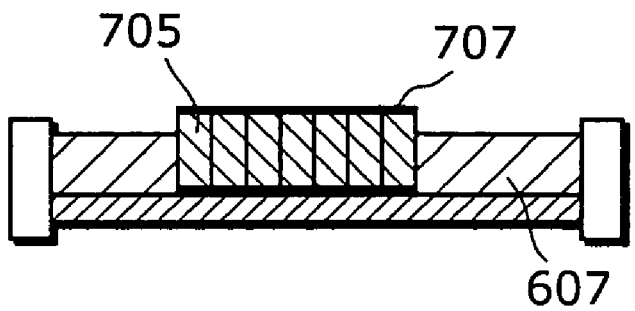

Tenth, the jig for sputtering 607 on which the bar-shaped wafers 705 are loaded is transferred from the glove box 602 to the sputtering chamber 604 once again. After that, as shown in FIG. 9F, coating of back end faces, which are the cleavage planes 704, of the bar-shaped wafers 705 which face upward is performed so that the back end face reflectivities of the semiconductor laser devices become 90 percent or the like, using the ECR sputtering method or the like, like in the case of front end face coating. In this way, back coating films 707, which are the multi-layers obtained by laminating films such as $SiO_2$ film of 70 nm and $TiO_2$ film of 35 nm twice, are deposited (Step S710).

Eleventh, after the sputtering is completed, $N_2$ gas is filled into the sputtering chamber 604 until the pressure inside the sputtering chamber 604 becomes approximately the same pressure as the ambient atmosphere, and the bar-shaped wafers 705 are transferred to the loading chamber 601 through the glove box 602 (Step S711). Here, before the transfer of the bar-shaped wafers 705, coating of the cleavage planes of the bar-shaped wafers 705, which are front and back faces of the semiconductor laser devices, have been performed.

Lastly, after the gate bulb placed between the loading chamber 601 and the glove box 602 is shut, $N_2$ gas is purged so as to return the pressure inside the loading chamber 601 to the pressure equal to the ambient atmosphere, and then the bar-shaped wafers 705 are extracted (Step S712).

Note that, in the case where a so-called second cleaving of the bar-shaped wafers 705 is performed in order to cut the bar-shaped wafers 705 into chip-shaped wafers 705, the following is performed after the process shown in Step S710: transferring the bar-shaped wafers 705 to the electron beam radiation chamber 603 once again through the glove box 602; and cutting the bar-shaped wafers 705 into chip-shaped wafers 705 by scanning the electron beam on them several times to the direction which is vertical to the already formed cleavage planes, that is, to the direction which is vertical to the longitudinal direction of the bar-shaped wafers 705. After that, the chip-shaped wafers are transferred to the glove box 602, and the chip-shaped wafers are divided apart. After that, the chip-shaped wafers are transferred to the loading chamber 601 and then extracted.

As described up to this point, with the semiconductor laser device manufacturing method of this embodiment, it becomes possible to perform end face coating without forming impurities such as organic impurities on the cleavage planes, especially on the light emitting parts. This is because the wafers having cleavage planes are kept in an inert gas atmosphere which does not contain oxygen and vapor. From the same reason as in the case of the semiconductor laser device manufacturing method of the first embodiment, this eliminates the reliability-related problem such as a decrease in light output resulting from end face deterioration which has been caused during the operation of the semiconductor laser devices. Therefore, the semiconductor laser device manufacturing method of this embodiment enables to realize highly reliable semiconductor laser devices.

In addition, the semiconductor laser device manufacturing method of this embodiment enables to form planarized cleavage planes with an excellent productivity because wafers are cleaved using an electron beam.

In addition, since a wafer is loaded on a jig in a glove box whose pressure is approximately the same pressure as the ambient atmosphere in the semiconductor laser device manufacturing method of this embodiment, the wafer can easily be loaded. Therefore, there is no need to prepare automated equipment which is required in the first embodiment, in order to perform the wafer loading onto the jig, and thus it becomes possible to realize a simple semiconductor laser device manufacturing method. In other words, it is possible to simplify the equipment structure required in the semiconductor laser device manufacturing method.

Up to this point the semiconductor laser device manufacturing method of the present invention has been described based on the above-described embodiments. However, the present invention is not limited to these embodiments and various kinds of variations and modifications are available without deviating from the scope of the present invention.

For example, the GaN system semiconductor laser device structure may have any composition ratio of IV-element mixed crystal which is represented as InGaAlN, and it may also contain V-group element such as As and P or III-group element such as B. Further, as the crystal growth method available in the present invention, the following methods may be used instead independently or in combination: the MOCVD method; the MBE (Molecular Beam Epitaxy) method; and the HVPE method.

In addition, the semiconductor laser structure may be formed on one of the following substrates: a SiC substrate; a GaN substrate; a Si substrate; a GaAs substrate; and an InP substrate. Additionally, the plane direction of the substrate may be the plane direction with an off-angle for a representative plane such as (0001).

Further, the semiconductor laser device manufacturing method of the present invention is not limited for the nitride semiconductor laser devices. More specifically, it is applicable for: one of InGaAlP system infrared semiconductor laser devices and AlGaAs system infrared semiconductor laser devices which are formed on a GaAs substrate; and the semiconductor laser devices which are formed using III to V group compound semiconductors such as InGaAsP system infrared semiconductor laser devices formed on an InP substrate.

Additionally, the embodiments of the present invention show examples where wafer cleaving and end face coating are performed in sequence in one of vacuum atmosphere or an inert gas atmosphere. However, for example, package mounting to be performed next to these processes may be performed also in one of vacuum atmosphere or an inert gas atmosphere.

In addition, in order to minimize the damage in cleavage planes, coating films have been formed in the semiconductor laser device manufacturing method of these embodiments according to the ECR sputtering method. However, the RF sputtering method or the like may be used for depositing coating films instead of the ECR sputtering method.

Additionally, end face coating may be performed after sputtering the cleavage planes to be coated in an inert gas.

Further, the semiconductor laser device manufacturing method may further include an ultraviolet ray radiation unit which radiates ultraviolet rays on the cleavage planes, and end face coating may be performed after ultraviolet rays are radiated on the cleavage planes to be coated.

INDUSTRIAL APPLICABILITY

The present invention is applicable for a semiconductor laser device manufacturing method. The present invention can be applied particularly to, for example, a method for cleaving a wafer on which nitride semiconductor laser devices intended for high density optical discs are formed and a method for coating the end faces of the cleaved wafers.

What is claimed is:

1. A semiconductor laser device manufacturing method comprising:
cutting a substrate by scanning, with an electron beam, a front side of the substrate on which a semiconductor laser structure has been formed so as to cause cracks which trigger said cutting of the substrate, said cutting being performed in an electron beam scanning chamber;
depositing coating films on end faces of the cut substrates, the end faces having been exposed in said cutting of the substrate, said depositing being performed in a coating film deposition chamber;
transferring the cut substrates from the electron beam scanning chamber to the coating film deposition chamber via a substrate transfer chamber which maintains a non-ambient atmosphere connected to both the electron beam scanning chamber and the coating film deposition chamber; and
turning the cut substrates, in a non-ambient atmosphere, in a way that the end faces of the cut substrates are vertical to thickness directions of the coating films deposited in said depositing,
wherein said cutting of the substrates includes cutting of the substrate into bar-shaped substrates by scanning the substrates with the electron beam several times in a way that scanning lines are straight and parallel, said depositing of the coating films includes depositing of the coating films on the end faces of the cut bar-shaped substrates, wherein said semiconductor laser device manufacturing method further comprises adhering an adhesive sheet to a back side of the substrate, wherein the back side is not to be scanned with the electron beam; and dividing apart the cut bar-shaped substrates by expanding the adhesive sheet, and wherein said turning of the cut substrates includes causing one of the end faces of each cut bar-shaped substrate to be parallel to a front side of the adhesive sheet by pressing upwardly a portion of the adhesive sheet adhered to the back side of each divided bar-shaped substrate, the portion being near the end face of each of the cut bar-shaped substrates.

2. The semiconductor laser device manufacturing method according to claim 1,
wherein the non-ambient atmosphere is a vacuum-evacuated atmosphere.

3. The semiconductor laser device manufacturing method according to claim 2,
wherein the vacuum-evacuated atmosphere has been vacuum-evacuated until a degree of vacuum of the atmosphere becomes $1\times10^{-3}$ Pa or below.

4. The semiconductor laser device manufacturing method according to claim 1,
wherein said depositing of the coating films further includes sub-depositing of coating films, and
said sub-depositing of the coating films includes: causing an opposing end face of each cut bar-shaped substrate to be parallel to the front side of the adhesive sheet by pressing upwardly a portion of the adhesive sheet which is adhered to the back side of each divided bar-shaped substrate, the portion being near the opposing end face of each substrate, opposite to the end face to which the coating film is formed.

5. The semiconductor laser device manufacturing method according to claim 1, said method further comprising
cutting the bar-shaped substrates into chip-shaped substrates by scanning the bar-shaped substrates with the electron beam several times.

6. The semiconductor laser device manufacturing method according to claim 5,
wherein said cutting of the substrate further includes cutting of the bar-shaped substrates into the chip-shaped substrates by scanning, with the electron beam, the bar-shaped substrates to a direction which is vertical to a longitudinal direction of the bar-shaped substrates.

7. The semiconductor laser device manufacturing method according to claim 1,
wherein said cutting of the substrate includes cutting of the substrate by scanning the substrate with the electron beam whose power density falls within a range from (a) a power density greater than a power density at which one of cracks and dislocations occur in the substrate to (b) a power density smaller than a power density at which the substrate is dissolved.

8. The semiconductor laser device manufacturing method according to claim 1, said method further comprising
depositing metal films on the front side, which is to be scanned with the electron beam, of the substrate.

9. The semiconductor laser device manufacturing method according to claim 1,
wherein said depositing of the coating films includes depositing of the coating films according to one of an electron cyclotron resonance sputtering method and a radio frequency sputtering method.

10. The semiconductor laser device manufacturing method according to claim 1,
wherein said depositing of the coating films includes depositing of the coating films on each end face of the cut substrates by depositing a multi-layer film which is made up of at least two different kinds of films.

11. The semiconductor laser device manufacturing method according to claim 1, said method further comprising
radiating ultraviolet rays on the end faces on which coating films are to be deposited.

12. The semiconductor laser device manufacturing method according to claim 1,
wherein the substrate includes a part which is made of one of SiC, sapphire, GaN, Si, GaAs and InP.

13. The semiconductor laser device manufacturing method according to claim 1,
wherein the substrate includes a semiconductor layer which is made of InGaAlN.

14. The semiconductor laser device manufacturing method according to claim 1, wherein the non-ambient atmosphere is an inert gas atmosphere.

15. The semiconductor laser device manufacturing method according to claim 14,
wherein the inert gas atmosphere contains $O_2$ and $H_2O$ with a concentration of 100 ppm or below.

* * * * *